(12) United States Patent
Suzuki et al.

(10) Patent No.: US 9,302,478 B2
(45) Date of Patent: Apr. 5, 2016

(54) SEMICONDUCTOR DEVICE, LIQUID DISCHARGE HEAD, LIQUID DISCHARGE CARTRIDGE, AND LIQUID DISCHARGE APPARATUS

(71) Applicant: CANON KABUSHIKI KAISHA, Tokyo (JP)

(72) Inventors: Tatsuya Suzuki, Oume (JP); Kazunari Fujii, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 28 days.

(21) Appl. No.: 14/067,029

(22) Filed: Oct. 30, 2013

(65) Prior Publication Data

US 2014/0139590 A1    May 22, 2014

(30) Foreign Application Priority Data

Nov. 20, 2012  (JP) .................................. 2012-254627

(51) Int. Cl.

| G11C 8/00 | (2006.01) |
|---|---|
| B41J 2/135 | (2006.01) |
| H01L 23/00 | (2006.01) |
| B41J 2/045 | (2006.01) |
| B41J 2/14 | (2006.01) |

(52) U.S. Cl.
CPC ................ B41J 2/135 (2013.01); B41J 2/0458 (2013.01); B41J 2/04506 (2013.01); B41J 2/14072 (2013.01); H01L 24/13 (2013.01); H01L 24/81 (2013.01)

(58) Field of Classification Search
CPC ........... H01L 2224/73204; H01L 2224/48227; H01L 24/13; H01L 24/81; H01L 2224/0401; H01L 23/49811; H01L 24/05; H01L 24/16; H01L 24/85; H01L 2224/04042; H01L 2224/49111; H01L 2225/06513; H01L 2223/54486; H01L 2223/6611; H04N 1/00557
USPC ......................................... 365/230.05, 63, 50
See application file for complete search history.

(56) References Cited

U.S. PATENT DOCUMENTS

| 8,562,111 | B2 * | 10/2013 | Fujii | ............................... 347/58 |
| 8,807,708 | B2 * | 8/2014 | Fujii | ............................... 347/58 |
| 2011/0292105 | A1 * | 12/2011 | Fujii | ................................ 347/9 |

FOREIGN PATENT DOCUMENTS

| JP | A 2005-104142 | 4/2005 |
| JP | A 2011-254801 | 12/2011 |

* cited by examiner

*Primary Examiner* — Fernando Hidalgo
(74) *Attorney, Agent, or Firm* — Fitzpatrick, Cella, Harper & Scinto

(57) ABSTRACT

A semiconductor device includes unit circuits arranged in a first direction, a bonding pad, and electrically conductive patterns configured to connect the unit circuits to the bonding pad. Each of the electrically conductive patterns includes a first portion connected to the bonding pad and extending in the first direction, and a second portion connected to the corresponding unit circuit. The electrically conductive patterns include a first type pattern in which the first portion is positioned on a first side of the second portion in a view from the first direction, and a second type pattern in which the first portion is positioned on a second side, which is opposite to the first side, of the second portion in a view from the first direction.

32 Claims, 7 Drawing Sheets

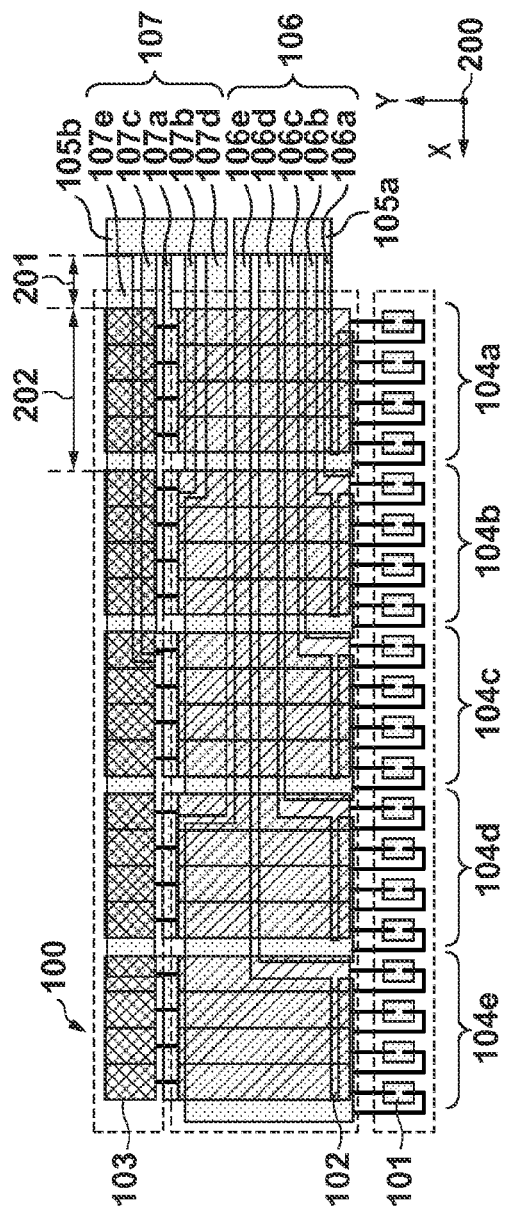
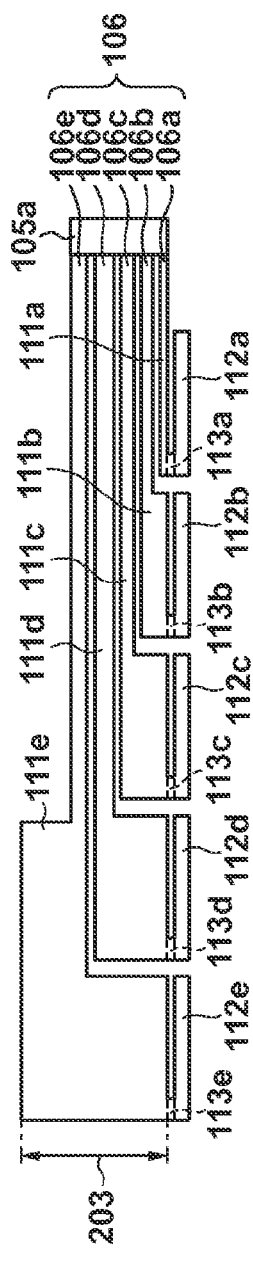
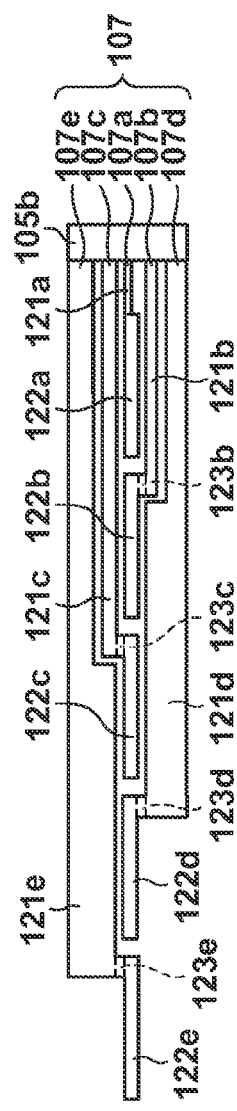
FIG. 2A
FIG. 2B
FIG. 2C

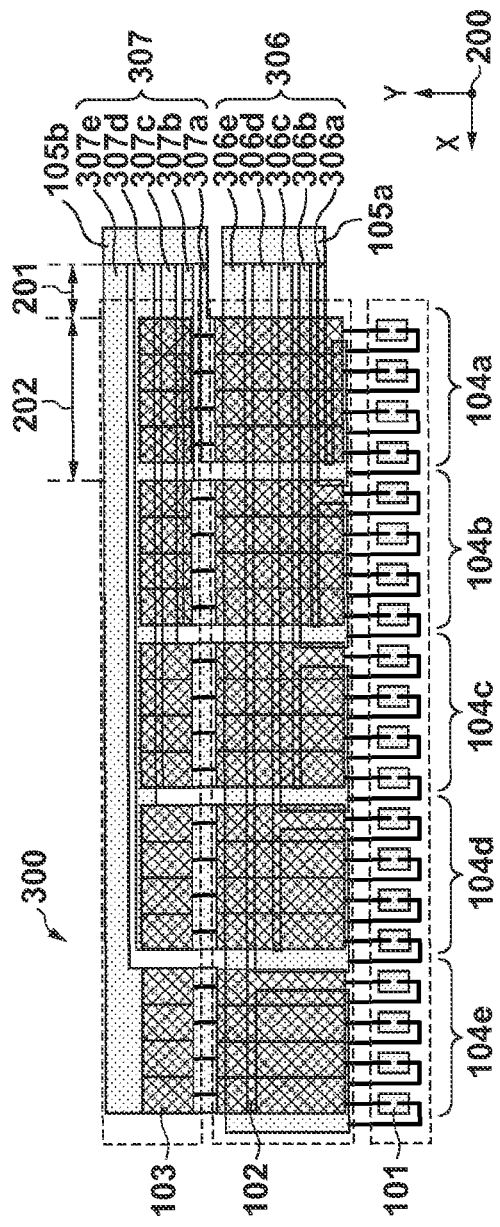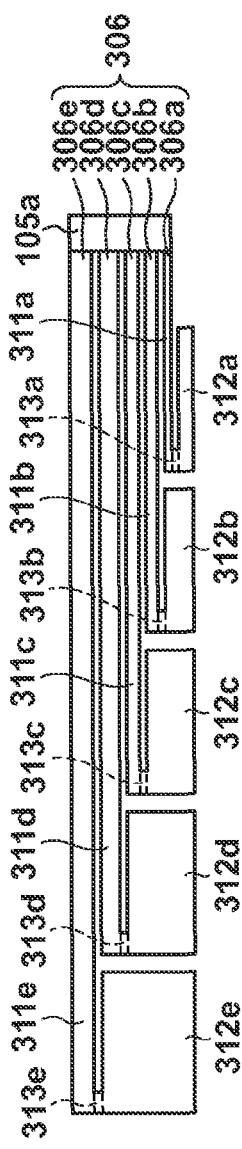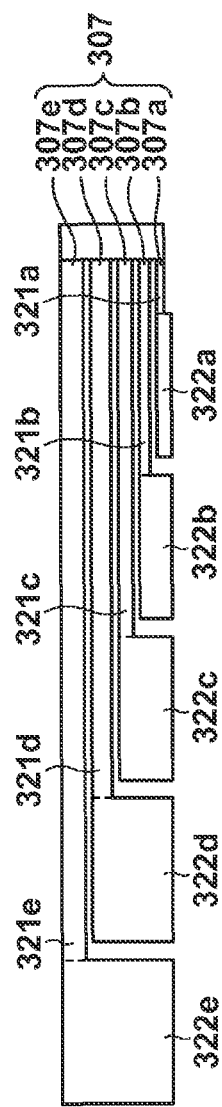
FIG. 3A
FIG. 3B
FIG. 3C

SEMICONDUCTOR DEVICE, LIQUID DISCHARGE HEAD, LIQUID DISCHARGE CARTRIDGE, AND LIQUID DISCHARGE APPARATUS

BACKGROUND OF THE INVENTION

1. Field of the Invention

The present disclosure relates to a semiconductor device, liquid discharge head, liquid discharge cartridge, and liquid discharge apparatus.

2. Description of the Related Art

A liquid discharge head for discharging a liquid from an orifice is used as an inkjet printing head by using ink or the like as a liquid, and depositing the ink on a print medium such as paper by controlling the discharge of the ink in accordance with a print signal. Also, a liquid discharge apparatus including this liquid discharge head is applied as, for example, an inkjet printing apparatus. An inkjet printing head using thermal energy selectively generates a bubble in a liquid by applying thermal energy generated by a heater to the liquid, and discharges an ink droplet from an orifice by the energy for generating a bubble. Recently, the number of orifices has been increased in order to increase the speed of printing. On the other hand, variations in resistance value from a bonding pad portion to each heater increase, and this makes it difficult to evenly supply electric power to a plurality of heaters. As a measure to cope with this problem, FIG. 5 of Japanese Patent Laid-Open No. 2005-104142 shows an arrangement in which an electrically conductive line for supplying electric power to a heater is divided into a plurality of electrically conductive lines, thereby reducing variations in resistance value of each electrically conductive line. Referring to FIG. 5, four heaters 101, four power transistors 102, and four logic circuits 103 form one segment (unit circuit). Variations in resistance value of a VH line to each segment are reduced by increasing the line width of a VH line connected to a segment positioned far from a bonding pad portion. This applies to a GNDH line from the bonding pad portion to each segment.

When the printing head disclosed in Japanese Patent Laid-Open No. 2005-104142 is made longer by increasing the number of heaters arranged on a semiconductor substrate, the number of divided electrically conductive lines connected to power supply pads increases. Since the line width from the bonding pad portion to each segment cumulatively increases, an area necessary for a wiring layout expands, and the size of the printing head increases. To solve this problem, Japanese Patent Laid-Open No. 2011-245801 proposes a wiring layout for suppressing the expansion of the wiring area.

SUMMARY OF THE INVENTION

According to some embodiments, a semiconductor device includes a plurality of unit circuits arranged in a first direction, a first bonding pad, and a plurality of first electrically conductive patterns configured to connect the plurality of unit circuits to the first bonding pad. Each of the plurality of first electrically conductive patterns includes a first portion connected to the first bonding pad and extending in the first direction, and a second portion connected to the corresponding unit circuit. The plurality of first electrically conductive patterns include a first type first electrically conductive pattern in which the first portion is positioned on a first side of the second portion in a view from the first direction, and a second type first electrically conductive pattern in which the first portion is positioned on a second side, which is opposite to the first side, of the second portion in a view from the first direction.

According to some other embodiments, a semiconductor device includes a plurality of unit circuits arranged in a first direction, a first bonding pad and a second bonding pad, a plurality of first electrically conductive patterns configured to connect the plurality of unit circuits to the first bonding pad, and a plurality of second electrically conductive patterns configured to connect the plurality of unit circuits to the second bonding pad. The plurality of first electrically conductive patterns and the plurality of second electrically conductive patterns are arranged in a second direction perpendicular to the first direction. A portion of one of the plurality of first electrically conductive patterns, which is positioned closest to the plurality of second electrically conductive patterns, and a portion of one of the plurality of second electrically conductive patterns, which is positioned closest to the plurality of first electrically conductive patterns, exist in positions overlapping each other in a view from the first direction.

Further features of the present invention will become apparent from the following description of exemplary embodiments (with reference to the attached drawings).

BRIEF DESCRIPTION OF THE DRAWINGS

FIGS. 2A to 2C are wiring layout diagrams of the semiconductor device of the embodiment shown in FIG. 1;

FIGS. 3A to 3C are wiring layout diagrams of a semiconductor device of a comparative example;

DESCRIPTION OF THE EMBODIMENTS

Figure 1:
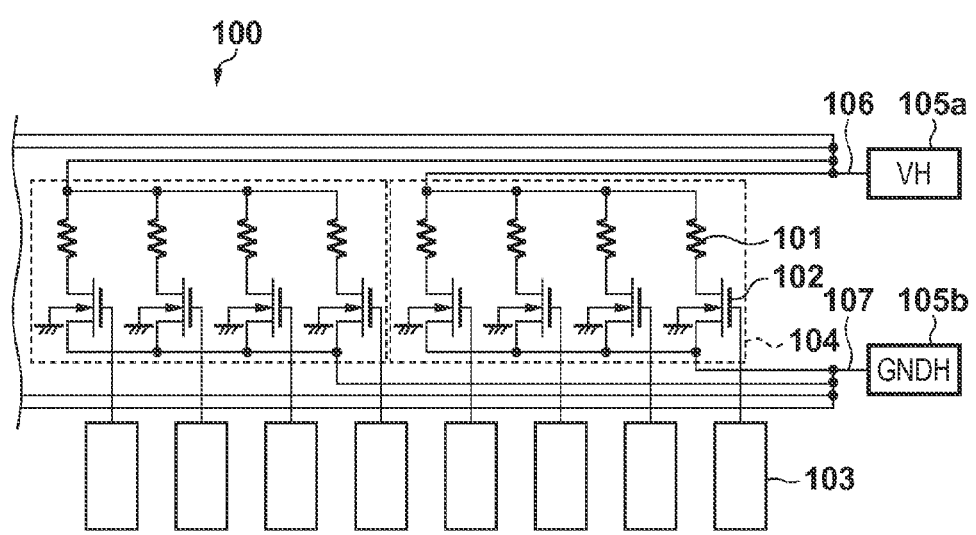
FIG. 1 is a circuit diagram of a semiconductor device of some embodiment.

The wiring layout proposed by Japanese Patent Laid-Open No. 2011-245801 suppresses the expansion of the wiring area in some cases. However, it is sometimes difficult to sufficiently suppress the expansion of the wiring area depending on the number and size of unit circuits, and the value of the minimum line space. Therefore, some embodiments provide a technique which suppresses the expansion of the wiring area while suppressing variations in wiring resistance value to each unit circuit, and differs from the conventional techniques.

Some embodiments of the present invention will be explained below with reference to the accompanying drawings. In a plurality of embodiments, the same reference numerals denote the same elements, and a repetitive explanation will be omitted. Also, it is possible to appropriately change and combine the embodiments. Some embodiments generally relate to a semiconductor device which includes a plurality of unit circuits arranged in a line, and in which an electrically conductive pattern is connected from a bonding pad to each unit circuit. As an example of this semiconductor device, a semiconductor device to be used to control an inkjet printing head for discharging ink by using thermal energy will be described below.

An example of the circuit configuration of a semiconductor device 100 according to some embodiments will be explained with reference to FIG. 1. A semiconductor substrate of the semiconductor device 100 can include a plurality of heaters 101 functioning as printing elements that apply thermal energy to ink as a liquid in a nozzle of an inkjet printing head in order to discharge the ink. When an electric current flows to the heater 101, heat is generated in accordance with the supplied electric current. The semiconductor substrate of the semiconductor device 100 may also include a plurality of n-type power transistors 102 functioning as driving circuits. Each power transistor 102 is connected to the heater 101, and supplies an electric current for driving the heater 101. In the semiconductor device 100, the heaters 101 and power transistors 102 are arranged in one-to-one correspondence with each other, and each pair forms one driving portion. Furthermore, a plurality of adjacent driving portions form one segment (unit circuit). In the semiconductor device 100 shown in FIG. 1, four adjacent driving portions form one segment 104 as an example.

Each segment 104 is connected to two bonding pads 105a and 105b by electrically conductive patterns. Electric power is supplied to the bonding pads 105a and 105b from the outside, for example, an inkjet printing apparatus. An electrically conductive pattern (second electrically conductive pattern) connected to the bonding pad 105a (a second bonding pad) will be called a VH line 106. An electrically conductive pattern (first electrically conductive pattern) connected to the bonding pad 105b (a first bonding pad) will be called a GNDH line 107. In the first embodiment, the bonding pad 105a has a positive potential, and the bonding pad 105b functions as ground. However, the bonding pad 105a may also function as ground, and the bonding pad 105b may also have a positive potential.

The VH line 106 branches near the bonding pad 105a, and each branched line extends to each segment 104. In each segment 104, the VH line 106 further branches, and each branched line is connected to each heater 101. Likewise, the GNDH line 107 branches near the bonding pad 105b, and each branched line extends to each segment 104. In each segment 104, the GNDH line 107 further branches, and each branched line is connected to each power transistor 102. By thus dividing the plurality of driving portions into segments and individually connecting the segments to the bonding pads 105a and 105b, it is possible to reduce the difference between electric powers to be supplied to the segments, which is caused by the difference between the wiring resistances.

The heater 101 has one end connected to the VH line 106, and the other end connected to the source or drain of the power transistor 102. One of the source and drain of the power transistor 102, which is not connected to the heater 101, is connected to the GNDH line 107. Also, the gate electrode of the power transistor is connected to a logic circuit 103. The logic circuit 103 can control the driving of the power transistor 102 by an external signal (not shown). Since the logic circuit 103 can have the same circuit configuration as that of a conventional logic circuit, an explanation of a practical circuit configuration will be omitted.

An example of the wiring layout of the semiconductor device 100 shown in FIG. 1 will be explained below with reference to FIGS. 2A to 2C. In this example shown in FIGS. 2A to 2C, the semiconductor device 100 includes five segments 104 arranged in a row, and the bonding pads 105a and 105b outside (for example, on the right sides of the drawings) the region where the segments 104 are formed. The five segments 104 will be called segments 104a, 104b, 104c, 104d, 104e in this order from the one nearest to the bonding pads 105a and 105b.

In the following explanation, a coordinate system 200 is set in a plane including the VH line 106 and GNDH line 107, such that the x-axis is taken on the line along which the segments 104a to 104e are arranged, and the y-axis is taken to be perpendicular to the x-axis. In each drawing, the leftward direction is an x-axis positive direction (first direction), and the upward direction is a y-axis positive direction (second direction). In this specification, "a first element exists on the left side (first side) of a second element" means that the first element exists in the x-axis positive direction of the second element in a view from the y-axis positive direction (that is, the x-coordinate value of the first element is larger than that of the second element). In this case, the first and second elements need not exist in positions overlapping each other in a view from the x-axis direction (that is, the ranges of the y-coordinate values need not overlap each other). Similarly, "a first element exists on the right side (second side) of a second element" means that the first element exists in an x-axis negative direction of the second element in a view from the y-axis positive direction (that is, the x-coordinate value of the first element is smaller than that of the second element). Also, "a first element exists above (on a first side of) a second element" means that the first element exists in the y-axis positive direction of the second element in a view from the x-axis direction (that is, the y-coordinate value of the first element is larger than that of the second element). In this case, the first and second elements need not exist in positions overlapping each other in a view from the y-axis direction (that is, the ranges of the x-coordinate values need not overlap each other). Analogously, "a first element exists below (on a second side of) a second element" means that the first element exists in a y-axis negative direction of the second element in a view from the x-axis direction (that is, the y-coordinate value of the first element is smaller than that of the second element).

In the semiconductor device 100 as shown in FIG. 2A, wiring layers are formed by using the multilayer wiring technique on a silicon semiconductor substrate on which elements are formed by using the semiconductor device manufacturing technique. In the embodiment shown in FIGS. 2A to 2C, for example, both the VH line 106 and GNDH line 107 can be formed by patterning an aluminum wiring layer positioned in the second layer and having a uniform thickness. In this formation method, the VH line 106 and GNDH line 107 can have the same thickness. The VH line 106 can be formed over a region where the power transistors 102 are formed. The GNDH line 107 can be formed over a region where the logic circuits 103 are formed, and the region where the power transistors 102 are formed. Consequently, the VH line 106 and GNDH line 107 are arranged in the y-axis direction. More specifically, the GNDH line 107 is positioned above the VH line 106.

Figure 5A:
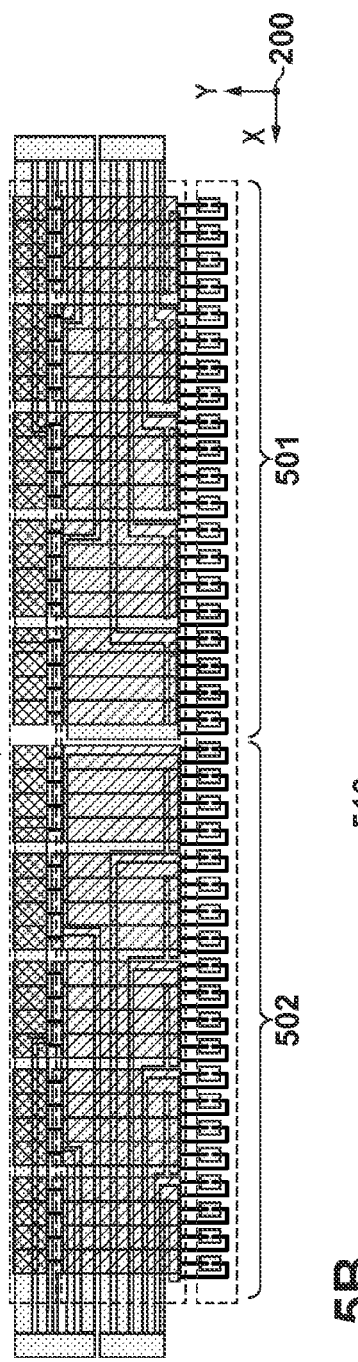
FIGS. 5A and 5B are wiring layout diagrams of another modification of the semiconductor device of the embodiment shown in FIG. 1.
Figure 5B:
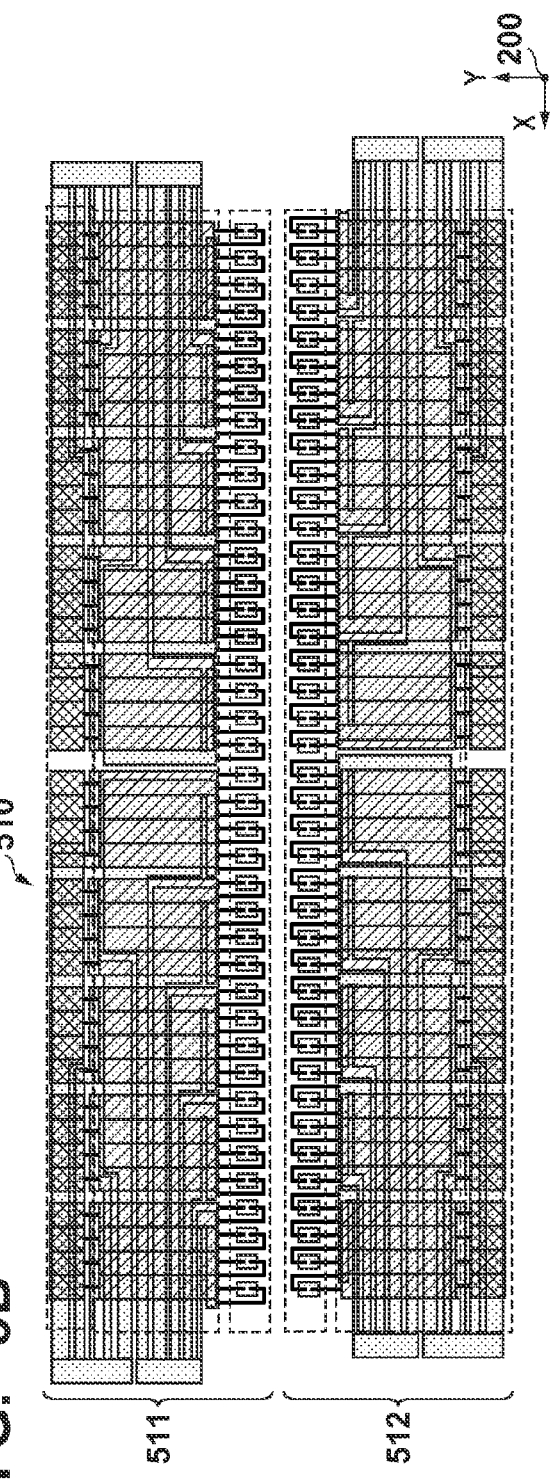

FIGS. 3A to 3C are wiring layout diagrams of a semiconductor device 300 as a comparative example for explaining the effect of the embodiment shown in FIGS. 2A to 2C. The semiconductor device 300 indicates a wiring layout expected when the two-segment wiring layout shown in FIG. 5 of Japanese Patent Laid-Open No. 2005-104142 is extended to five segments. The same reference numerals as in FIGS. 2A to 2C denote the same elements, and a repetitive explanation will be omitted. The semiconductor device 300 differs from the semiconductor device 100 in that the semiconductor device 300 includes a VH line 306 and GNDH line 307 instead of the VH line 106 and GNDH line 107.

Next, a detailed shape of the VH line 106 will be explained with reference to FIG. 2B. FIG. 2B is a view specifically showing the VH line 106 and bonding pad 105a shown in FIG. 2A. The VH line 106 can include five independent electrically conductive patterns 106a to 106e. Each of the electrically conductive patterns 106a to 106e has one end connected to the bonding pad 105a, and the other end connected to a corresponding one of the segments 104a to 104e. Consequently, electric power is supplied from the bonding pad 105a to the segment 104a through the electrically conductive pattern 106a. This applies to the electrically conductive patterns 106b to 106e. Referring to FIG. 2B, the electrically conductive patterns 106a to 106e are individually connected to the bonding pad 105a. However, the electrically conductive patterns 106a to 106e may also join near the bonding pad 105a. The electrically conductive patterns 106a to 106e can respectively include first portions 111a to 111e, second portions 112a to 112e, and third portions 113a to 113e. The patterns are thus divided only for explanation, so the electrically conductive patterns 106a to 106e need not be formed by connecting different metal plates, and may also be formed by patterning a single wiring layer. For the sake of explanation, FIG. 2B shows each boundary by the dotted line.

Shapes common to the electrically conductive patterns 106a to 106e will be explained by using the electrically conductive pattern 106a. The first portion 111a of the electrically conductive pattern 106a is connected to the bonding pad 105a, and extends in the x-axis direction. The second portion 112a of the electrically conductive pattern 106a is connected to the segment 104a, and extends in the x-axis direction. More specifically, the second portion 112a of the electrically conductive pattern 106a is connected to each heater 101 included in the segment 104a. The second portion 112a is arranged in a position overlapping the power transistor 102 of the segment 104a. The third portion 113a is connected to both the first portion 111a and second portion 112a. The third portion 113a is connected to the left end portion of the first portion 111a. Also, the third portion 113a is connected to the left end portion of the second portion 112a. The first portion 111a is positioned above the second portion 112a, and the third portion 113a is positioned between the first portion 111a and second portion 112a in the y-axis direction.

Shapes unique to each of the electrically conductive patterns 106a to 106e will now be explained. The first portion 111a of the electrically conductive pattern 106a is a rectangle. More specifically, the width (the length in the y-axis direction) of the first portion 111a is constant regardless of the position in the x-axis direction. The first portions 111b to 111d of the electrically conductive patterns 106b to 106d are L-shaped. This will be explained in more detail by using the electrically conductive pattern 106b. In a path from the bonding pad 105a to the segment 104b, the first portion 111b has an arrangement in which a portion having a constant width continues partway, the width then increases downward, and a portion having a constant width continues again after that. The first portion 111e of the electrically conductive pattern 106e is substantially L-shaped. More specifically, in a path from the bonding pad 105a to the segment 104e, the first portion 111e has an arrangement in which a portion having a constant width continues partway, the width then increases upward, and a portion having a constant width continues again after that. The width then increases downward, and a portion having a constant width continues again after that.

The mutual relationship of the electrical conductive patterns 106a to 106e will be explained below. The shapes and sizes of the electrically conductive patterns 106a to 106e can be determined so as to supply even electric power from the bonding pad 105a to the segments 104a to 104e. For example, the shapes and sizes of the electrically conductive patterns 106a to 106e can be determined so that the resistance values of the electrically conductive patterns 106a to 106e from the bonding pad 105a to the segments 104a to 104e are equal. Even when the resistance values of the electrically conductive patterns 106a to 106e are not equal, if the variation in resistance value is less than 10%, no degradation occurs in the printing performance of the inkjet printing apparatus, particularly, no degradation of image quality occurs. Generally, the path lengths of the electrically conductive patterns 106a to 106e increase as the segments 104 to which these patterns are connected are positioned far from the bonding pad 105a, so the widths of the patterns must be increased accordingly.

All the electrically conductive patterns 106a to 106e are arranged in the y-axis direction near the bonding pad 105a. Therefore, the expansion of the area occupied by the VH line 106 can be suppressed by reducing the widths of the electrically conductive patterns 106a to 106e near the bonding pad 105a. In the path from the bonding pad 105a to the segment 104b, the width of the first portion 111b of the electrically conductive pattern 106b increases beyond the region where the electrically conductive pattern 106a connected to the segment 104a immediately before the segment 104b is formed. The resistance value of the electrically conductive pattern 106b can be decreased by thus increasing the width. This makes it possible to reduce the width of the electrically conductive pattern 106b near the bonding pad 105a. This applies to the electrically conductive patterns 106c to 106e.

The second portions 112a to 112e of the electrically conductive patterns 106a to 106e can have the same shape and the same size. In the practical example, the second portions 112a to 112e have a rectangular shape, have the same length in the x-axis direction, and have the same length (width) in the y-axis direction. In this arrangement, the resistance values per unit length of the second portions 112a to 112e become equal to each other, so variations in electric power to be supplied to the heaters 101 between the segments can be reduced. Furthermore, when the second portions 112a to 112e are connected to electrically conductive patterns of another wiring layer, the widths of the second portions 112a to 112e may also be adjusted so that the combined resistances per unit length in the x-axis direction of these second portions and the connected electrically conductive patterns are equal. Also, the second portions 112a to 112e may also be arranged in the x-axis direction so that the segments 104a to 104e and second portions 112a to 112e have the same positional relationship. In the practical example, the y-coordinate values of the second portions 112a to 112e are equal.

Next, a detailed shape of the VH line 306 will be explained with reference to FIG. 3B. FIG. 3B is a view specifically showing the VH line 306 and bonding pad 105a shown in FIG. 3A. The VH line 306 has five independent electrically conductive patterns 306a to 306e. Each of the electrically conductive patterns 306a to 306e has one end connected to the bonding pad 105a, and the other end connected to a corresponding one of the segments 104a to 104e. The electrically conductive patterns 306a to 306e respectively include first portions 311a to 311e, second portions 312a to 312e, and third portions 313a to 313e. For the sake of explanation, FIG. 3B shows each boundary by the dotted line.

Arrangements common to the electrically conductive patterns 306a to 306e will be explained by using the electrically conductive pattern 306a. The first portion 311a of the electrically conductive pattern 306a is connected to the bonding pad 105a, and extends in the x-axis direction. The second portion 312a of the electrically conductive pattern 306a is connected to the segment 104a, and extends in the x-axis direction. More specifically, the second portion 312a of the electrically conductive pattern 306a is connected to each heater 101 included in the segment 104a. The second portion 312a is arranged in a position overlapping the power transistor 102 of the segment 104a. The third portion 313a is connected to both the first portion 311a and second portion 312a. The third portion 313a is connected to the left end portion of the first portion 311a. Also, the third portion 313a is connected to the left end portion of the second portion 312a. The first portion 311a is positioned above the second portion 312a, and the third portion 313a is positioned between the first portion 311a and second portion 312a in the y-axis direction. The portions 311a to 311e, 312a to 312e, and 313a to 313e of the electrically conductive patterns 306a to 306e are rectangles.

The results of comparison of the minimum widths of the first portions of the electrically conductive patterns of the VH lines 106 in the semiconductor device 100 according to some embodiments and the semiconductor device 300 of the comparative example will be explained below. As preconditions for the comparison, a distance 201 between the bonding pad 105a and the segment 104a closest to the bonding pad 105a is 0.5 mm, a pitch 202 of the segments is 1 mm, and the minimum line space (L/S) of the electrically conductive patterns is 5 μm. Also, in the semiconductor device 100, a maximum width 203 of the first portion 111e of the electrically conductive pattern 106e is 0.15 mm. In addition, the resistance values of the electrically conductive patterns from the bonding pad 105a to the segments 104a to 104e are set equal to each other, and the sum total of the widths of those portions of the electrically conductive patterns, which are connected to the bonding pad 105a, is minimized. Under the preconditions as described above, the widths of the first portions of the electrically conductive patterns of the VH lines 106 and 306 are as shown in Table 1 below. "Total value" represents the total value of the minimum widths of the first portions of the electrically conductive patterns. For the semiconductor device 100, the maximum widths of the first portions 111a to 111e are also described in Table 1 for reference.

TABLE 1

| Semiconductor device 100 (this embodiment) | | | Semiconductor device 300 (comparative example) | |
|---|---|---|---|---|
| | Minimum width of first portion | Maximum width of first portion | | Minimum width of first portion |
| Electrically conductive pattern 106a | 5.0 | 5.0 | Electrically conductive pattern 306a | 5.0 |
| Electrically conductive pattern 106b | 6.3 | 16.3 | Electrically conductive pattern 306b | 8.4 |
| Electrically conductive pattern 106c | 9.4 | 30.7 | Electrically conductive pattern 306c | 11.7 |
| Electrically conductive pattern 106d | 12.7 | 48.4 | Electrically conductive pattern 306d | 15.1 |
| Electrically conductive pattern 106e | 12.4 | 150.0 | Electrically conductive pattern 306e | 18.5 |
| Total value | 33.3 | — | Total value | 58.7 |

Unit: μm

Table 1 reveals that the total value of the minimum widths of the first portions of the VH line 106 of the semiconductor device 100 of some embodiments is smaller by 22% than the total value of the minimum widths of the first portions of the VH line 306 of the semiconductor device 300 of the comparative example.

Next, a detailed shape of the GNDH line 107 will be explained with reference to FIG. 2C. FIG. 2C is a view specifically showing the GNDH line 107 and bonding pad 105b shown in FIG. 2A. The GNDH line 107 can include five independent electrically conductive patterns 107a to 107e. Each of the electrically conductive patterns 107a to 107e has one end connected to the bonding pad 105b, and the other end connected to a corresponding one of the segments 104a to 104e. Consequently, electric power is supplied from the bonding pad 105b to the segment 104a through the electrically conductive pattern 107a. This applies to the electrically conductive patterns 107b to 107e. Referring to FIG. 2C, the electrically conductive patterns 107a to 107e are individually connected to the bonding pad 105b. However, the electrically conductive patterns 107a to 107e may also join near the bonding pad 105b. The electrically conductive pattern 107a can include a first portion 121a and second portion 122a, and the electrically conductive patterns 107b to 107e can respectively include first portions 121b to 121e, second portions 122b to 122e, and third portions 123b to 123e. The patterns are thus divided only for explanation, so the electrically conductive patterns 107a to 107e need not be formed by connecting different metal plates, and may also be formed by patterning a single wiring layer. For the sake of explanation, FIG. 2C shows each boundary by the dotted line.

Shapes common to the electrically conductive patterns 107a to 107e will be explained by using the electrically conductive pattern 107a. The first portion 121a of the electrically conductive pattern 107a is connected to the bonding pad 105b, and extends in the x-axis direction. The second portion 122a of the electrically conductive pattern 107a is connected to the segment 104a, and extends in the x-axis direction. More specifically, the second portion 122a of the electrically conductive pattern 107a is connected to each power transistor 102 included in the segment 104a. The second portion 122a is arranged in a position overlapping the power transistor 102 of the segment 104a.

Shapes unique to each of the electrically conductive patterns 107a to 107e will now be explained. In the electrically conductive pattern 107b, the third portion 123b is connected to both the first portion 121b and second portion 122b. The third portion 123b is connected to the left end portion of the first portion 121b. Also, the third portion 123b is connected to the right end portion of the second portion 122b. The same portions of the electrically conductive patterns 107c to 107e also have the same connection relationships. By contrast, in the electrically conductive pattern 107a, the left end portion of the first portion 121a and the right end portion of the second portion 122a are connected without any third portion.

In the electrically conductive pattern 107a, the first portion 121a and second portion 122a are arranged in positions overlapping each other in the x-axis direction. In the electrically conductive pattern 107b, the first portion 121b exists below the second portion 122b, and the third portion 123b is positioned between the first portion 121b and second portion 122b in the y-axis direction. The same portions of the electrically conductive pattern 107d also have the same positional relationships. An electrically conductive pattern in which the first portion exists below the second portion will be called a first type electrically conductive pattern hereinafter. In the electrically conductive pattern 107c, the portion 121c exists above the second portion 122c, and the third portion 123c is positioned between the first portion 121c and second portion 122c in the y-axis direction. The same portions of the electrically conductive pattern 107e also have the same positional relationships. An electrically conductive pattern in which the first portion exists above the second portion will be called a second type electrically conductive pattern hereinafter.

The first portions 121a to 121c of the electrically conductive patterns 107a to 107c are rectangles. More specifically, the widths of the first portions 121a to 121c are constant regardless of the position in the x-axis direction. The first portions 121d and 121e of the electrically conductive patterns 107d and 107e are L-shaped. This will be explained in more detail by using the first type electrically conductive pattern 107d. In a path from the bonding pad 105b to the segment 104d, the first portion 121d has an arrangement in which a portion having a constant width continues partway, the width then increases upward, and a portion having a constant width continues again after that. In the second type electrically conductive pattern 107e, the width of the first portion 121e increases downward partway. However, the two types are the same in that the width increases toward the second portion.

The mutual relationship of the electrical conductive patterns 107a to 107e will be explained below. The shapes and sizes of the electrically conductive patterns 107a to 107e can be determined so as to supply even electric power from the bonding pad 105b to the segments 104a to 104e. For example, the shapes and sizes of the electrically conductive patterns 107a to 107e can be determined so that the resistance values of the electrically conductive patterns 107a to 107e from the bonding pad 105b to the segments 104a to 104e are equal. Even when the resistance values of the electrically conductive patterns 107a to 107e are not equal, if the variation in resistance value is less than 10%, no degradation occurs in the printing performance of the inkjet printing apparatus, particularly, no degradation of image quality occurs. Generally, the path lengths of the electrically conductive patterns 107a to 107e increase as the segments 104 to which these patterns are connected are positioned far from the bonding pad 105b, so the widths of the patterns must be increased accordingly.

All the electrically conductive patterns 107a to 107e are arranged in the y-axis direction near the bonding pad 105b. Therefore, the expansion of the area occupied by the GNDH line 107 can be suppressed by reducing the widths of the electrically conductive patterns 107a to 107e near the bonding pad 105b. In the path from the bonding pad 105b to the segment 104d, the width of the first portion 121d of the electrically conductive pattern 107d increases beyond the region where the first portion 121b of the electrically conductive pattern 107b connected to the segment 104b positioned two segments before the segment 104d is formed. The resistance value of the electrically conductive pattern 107d can be decreased by thus increasing the width. This makes it possible to reduce the width of the electrically conductive pattern 107d near the bonding pad 105b.

In the embodiment shown in FIGS. 2A to 2C, the second portions 122b and 122d of the first type electrically conductive patterns 107b and 107d and the second portions 122c and 122e of the second type electrically conductive patterns 107c and 107e are alternately arranged along the x-axis direction. In other words, in a portion to be connected to the bonding pad 105b, the electrically conductive pattern 107a connected to the segment 104a closest to the bonding pad 105b is arranged in the central portion in the y-axis direction. The electrically conductive patterns 107b to 107e are alternately arranged above and below the electrically conductive pattern 107a from the one connected to the segment closest to the bonding pad 105b. Accordingly, the first portion 121d of the first type electrically conductive pattern 107d and the first portion 121c of the second type electrically conductive pattern 107c are arranged on opposite sides of the array of the second portions 122a to 122e. This makes it possible to increase the width of the first portion 121d of the electrically conductive pattern 107d in a position close to the bonding pad 105b, when compared to an electrically conductive pattern 307d of the comparative example (to be described later). Consequently, the minimum width (the width of a portion to be connected to the bonding pad 105b) of the first portion 121d of the electrically conductive pattern 107d can be reduced. Both the first and second type electrically conductive patterns can have this effect. In some embodiments, the first and second type electrically conductive patterns are alternately arranged. However, the above-mentioned effect can be achieved as long as the device includes the two types of electrically conductive patterns. For example, the width of the first portion of the second type electrically conductive pattern need only be increased in a region where no first portion of the first type electrically conductive pattern is formed.

The second portions 122a to 122e of the electrically conductive patterns 107a to 107e can have the same shape and the same size. In the practical example, the second portions 122a to 122e have a rectangular shape, have the same length in the x-axis direction, and have the same length (width) in the y-axis direction. In this arrangement, the resistance values per unit length of the second portions 122a to 122e become equal to each other, so variations in electric power to be supplied to the power transistor 102 between the segments can be reduced. Furthermore, when the second portions 122a to 122e are connected to electrically conductive patterns of another wiring layer, the widths of the second portions 122a to 122e may also be adjusted so that the combined resistances per unit length in the x-axis direction of these second portions and the connected electrically conductive patterns are equal. Also, the second portions 122a to 122e may also be arranged in the x-axis direction so that the segments 104a to 104e and second portions 122a to 122e have the same positional relationship. In the practical example, the y-coordinate values of the second portions 122a to 122e are equal.

Next, a detailed shape of the GNDH line 307 will be explained with reference to FIG. 3C. FIG. 3C is a view specifically showing the GNDH line 307 and bonding pad 105b shown in FIG. 3A. The GNDH line 307 has five independent electrically conductive patterns 307a to 307e. Each of the electrically conductive patterns 307a to 307e has one end connected to the bonding pad 105b, and the other end connected to a corresponding one of the segments 104a to 104e. The electrically conductive patterns 307a to 307e respectively include first portions 321a to 321e and second portions 322a to 322e. For the sake of explanation, FIG. 3C shows each boundary by the dotted line.

Arrangements common to the electrically conductive patterns 307a to 307e will be explained by using the electrically conductive pattern 307a. The first portion 321a of the electrically conductive pattern 307a is connected to the bonding pad 105b, and extends in the x-axis direction. The second portion 322a of the electrically conductive pattern 307a is connected to the segment 104a, and extends in the x-axis direction. More specifically, the second portion 322a of the electrically conductive pattern 307a is connected to each power transistor 102 included in the segment 104a. The second portion 322a is arranged in a position overlapping a region above the power transistor 102 of the segment 104a. The left end portion of the first portion 321a and the right end portion of the second portion 322a are directly connected. The first portion 321a is positioned above the second portion 322a. The portions 321a to 321e and 322a to 322e of the electrically conductive patterns 307a to 307e are rectangles.

The results of comparison of the minimum widths of the first portions of the electrically conductive patterns of the GNDH lines 107 in the semiconductor device 100 according to some embodiments and the semiconductor device 300 of the comparative example will be explained below. As preconditions for the comparison, the distance 201 between the bonding pad 105b and the segment 104a closest to the bonding pad 105b is 0.5 mm, the pitch 202 of the segments is 1 mm, and the minimum line space (L/S) of the electrically conductive patterns is 5 μm. Also, the resistance values of the electrically conductive patterns from the bonding pad 105b to the segments 104a to 104e are set equal to each other, and the sum total of the widths of those portions of the electrically conductive patterns, which are connected to the bonding pad 105b, is minimized. Under the preconditions as described above, the widths of the first portions of the electrically conductive patterns of the GNDH lines 107 and 307 are as shown in Table 2 below. "Total value" represents the total value of the minimum widths of the first portions of the electrically conductive patterns. For the semiconductor device 100, the maximum widths of the first portions 121a to 121e are also described in Table 2 for reference.

TABLE 2

| Semiconductor device 100 (this embodiment) | | Semiconductor device 300 (comparative example) | |
| --- | --- | --- | --- |
| Minimum width of first portion | Maximum width of first portion | | Minimum width of first portion |
| Electrically conductive pattern 107a  5.0 | 5.0 | Electrically conductive pattern 307a | 5.0 |
| Electrically conductive pattern 107b  15.0 | 15.0 | Electrically conductive pattern 307b | 15.0 |
| Electrically conductive pattern 107c  25.0 | 25.0 | Electrically conductive pattern 307c | 25.0 |
| Electrically conductive pattern 107d  26.7 | 51.7 | Electrically conductive pattern 307d | 35.0 |
| Electrically conductive pattern 107e  35.6 | 70.6 | Electrically conductive pattern 307e | 45.0 |
| Total value  107.3 | — | Total value | 125.0 |

Unit: μm

Table 2 reveals that the total value of the minimum widths of the first portions of the GNDH line 107 of the semiconductor device 100 of some embodiments is smaller by 15% than the total value of the minimum widths of the first portions of the GNDH line 307 of the semiconductor device 300 of the comparative example.

As described above, in the semiconductor device 100 including the VH line 106 and GNDH line 107, it is possible to suppress variations in wiring resistance value to each segment, and decrease the total value of the minimum widths of the electrically conductive patterns. Consequently, a small-sized semiconductor device 100 is provided, and the number of chips formable by one wafer increases. This makes it possible to reduce the manufacturing cost of one chip.

Even in a semiconductor device combining the GNDH line 107 according to the embodiments and the VH line 306 of the comparative example, the total value of the minimum widths of the electrically conductive patterns can be made smaller than that in the semiconductor device 300 of the comparative example. However, in the semiconductor device 100 including both the VH line 106 and GNDH line 107, as shown in FIG. 2A, a portion of the electrically conductive pattern 106e of the VH line 106 and the electrically conductive pattern 107e of the GNDH line 107 are arranged in positions overlapping each other in a view from the x-axis direction. When compared to the device using either the VH line 106 or GNDH line 107, therefore, it is possible to reduce the distance from the upper end to the lower end in the y-axis direction of the area occupied by the VH line 106 and GNDH line 107.

In the semiconductor device 100, the left end portion (first end portion) of the second portion of the electrically conductive pattern of the VH line 106 is connected to another portion of this electrically conductive pattern, and the right end portion (second end portion) of the second portion of the electrically conductive pattern of the GNDH line 107 is connected to another portion of this electrically conductive pattern. In each segment 104, therefore, the path length from the bonding pad 105a to a driving portion decreases toward the left side, and the path length from the bonding pad 105b to a driving portion increases toward the left side. This makes it possible to reduce the difference between the wiring resistance values with respect to driving portions in the same segment. In a modification of the embodiment shown in FIG. 1, the right end portion of the second portion of the electrically conductive pattern of the VH line 106 may also be connected to another portion of this electrically conductive pattern, and the left end portion of the second portion of the electrically conductive pattern of the GNDH line 107 may also be connected to another portion of this electrically conductive pattern. Furthermore, the second portions 112a to 112e of the electrically conductive patterns 106a to 106e and the second portions 122a to 122e of the electrically conductive patterns 107a to 107e may also have the same shape and the same size.

In the semiconductor device 100, both the bonding pads 105a and 105b are positioned on the right side of the segment 104. However, these bonding pads may also be positioned on the left side of the segment 104, or one bonding pad may be positioned on the right side, and the other bonding pad may be positioned on the left side.

Figure 4A:
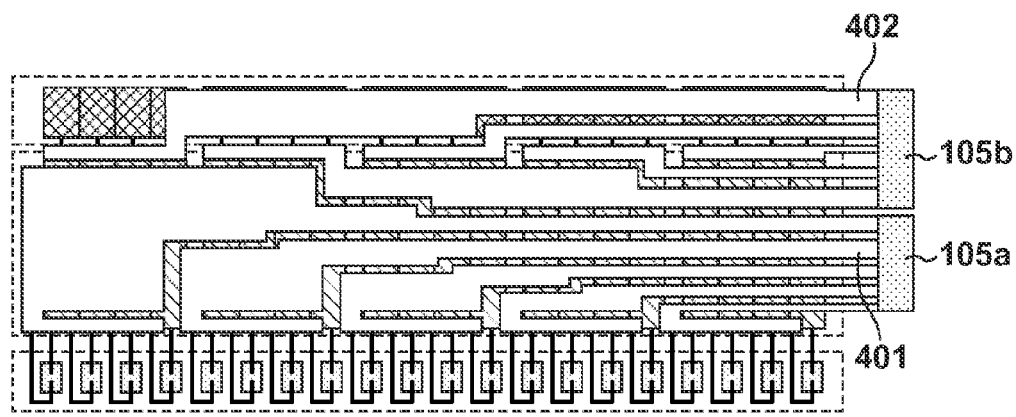
FIGS. 4A and 4B are wiring layout diagrams of a modification of the semiconductor device of the embodiment shown in FIG. 1.
Figure 4B:
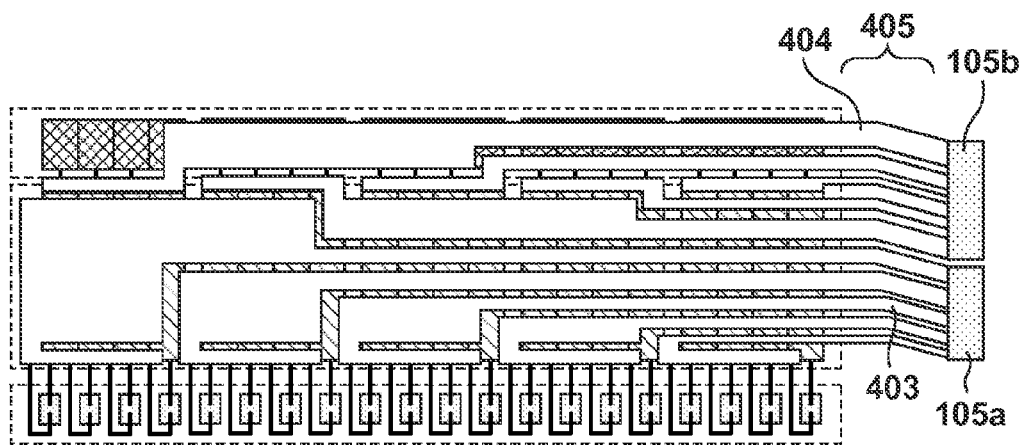

The corner of each portion of the electrically conductive patterns 106a to 106e and 107a to 107e need not have a right angle, and may also be filleted or rounded. For example, the electrically conductive patterns may also have a staircase shape like a VH line 401 and GNDH line 402 shown in FIG. 4A, or a combination of a plurality shapes such as a parallelogram (not shown). Also, like a VH line 403 and GNDH line 404 shown in FIG. 4B, the first portions 111a to 111e and 121a to 121e may also bend in a region 405 near the bonding pads 105a and 105b.

In the semiconductor device 100, the number of segments is four, and the number of heaters 101 in one segment is 4. However, the printing speed and printing accuracy are improved by increasing the total number of heaters by increasing the number of segments and the number of heaters in one segment. When the number of segments is increased, the wiring area expands because the numbers of VH lines and GNDH lines increase, so the effect of some embodiments more significantly appears. In addition, two semiconductor devices 100 may also be arranged in the x-axis direction like a semiconductor device 500 shown in FIG. 5A. In this arrangement, semiconductor devices 501 and 502 are symmetrical with respect to the y-axis. Furthermore, two semiconductor devices 500 may also be arranged in the y-axis direction like a semiconductor device 510 shown in FIG. 5B.

In this arrangement, semiconductor devices 511 and 512 are symmetrical with respect to the x-axis.

Figure 6A:
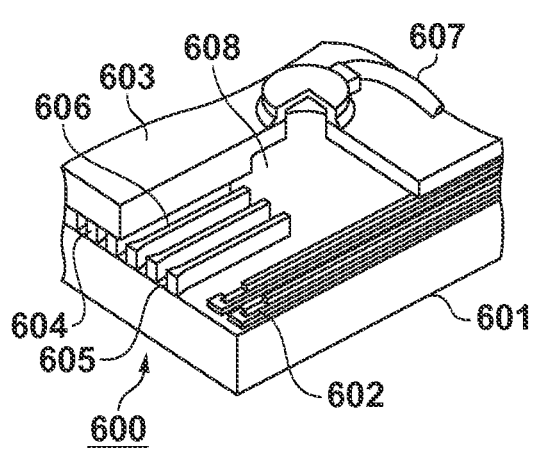
FIGS. 6A to 6D are views for explaining some other embodiments.

As some other embodiments, a liquid discharge head, liquid discharge cartridge, and liquid discharge apparatus using the semiconductor device 100 explained in the embodiment shown in FIG. 1 will be explained below with reference to FIGS. 6A to 6D. FIG. 6A shows the main parts of a printing head 600 including the semiconductor device 100 explained in the embodiment shown in FIG. 1 as a substrate 601, as an example of the liquid discharge head. Referring to FIG. 6A, the heater 101 of the embodiment shown in FIG. 1 is drawn as a heat generating unit 602. Also, a top plate 603 is partially cut away for the sake of explanation. As shown in FIG. 6A, the printing head 600 can be configured by combining, to the substrate 601, liquid channel wall members 606 for forming liquid channels 605 communicating with a plurality of orifices 604, and the top plate 603 having an ink supply port 607. In this structure, ink injected from the ink supply port 607 is stored in an internal common ink chamber 608, supplied to each liquid channel 605, and discharged from the orifice 604 by driving the substrate 601 in this state.

Figure 6B:
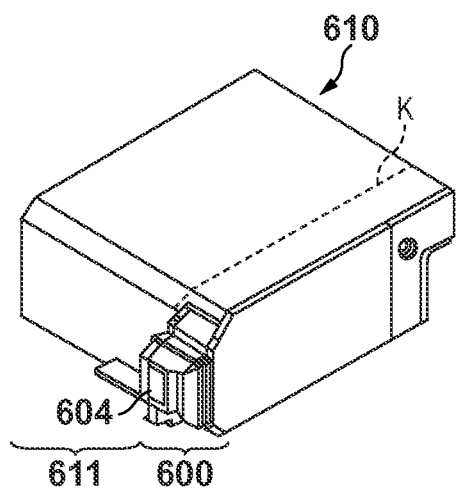

FIG. 6B is a view for explaining the overall arrangement of an inkjet cartridge 610 as an example of the liquid discharge cartridge. The cartridge 610 includes the printing head 600 having the plurality of orifices 604 described above, and an ink tank 611 for holding ink to be supplied to the printing head 600. The ink tank 611 as a liquid tank is attached to the printing head 600 so as to be detachable from a boundary line K. The cartridge 610 has an electrical contact (not shown) for receiving a driving signal from the carriage side when mounted in a printing apparatus shown in FIG. 6C, and the heat generating unit 602 is driven by this driving signal. The ink tank 611 contains fibrous or porous ink absorbers for holding ink, and ink is held by these ink absorbers.

Figure 6C:
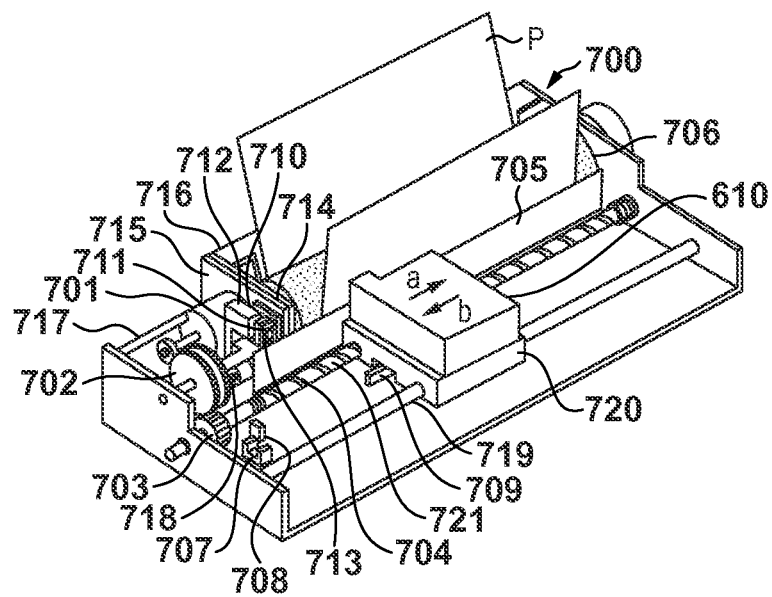

FIG. 6C is a perspective view showing the outer appearance of an inkjet printing apparatus 700 as an example of the liquid discharge apparatus. The inkjet printing apparatus 700 incorporates the cartridge 610, and can realize high-speed printing and high-image-quality printing by controlling a signal to be applied to the cartridge 610. In the inkjet printing apparatus 700, the cartridge 610 is mounted on a carriage 720 that engages with a spiral groove 721 of a lead screw 704 that rotates in synchronism with the forward rotation-reversal rotation of a driving motor 701 via driving force transmission gears 702 and 703. The cartridge 610 can move back and forth together with the carriage 720 along a guide 719 in the directions of arrows a and b by the driving force of the driving motor 701. A paper pressing plate 705 for print paper P conveyed onto a platen 706 by a print medium supply device (not shown) presses the print paper P against the platen 706 along the carriage moving direction. Photocouplers 707 and 708 detect a home position in order to check, in a region where the photocouplers 707 and 708 are formed, the existence of a lever 709 of the carriage 720, and, for example, switch the rotational directions of the driving motor 701. A support member 710 supports a cap member 711 for capping the entire surface of the cartridge 610. A suction unit 712 sucks the interior of the cap member 711, thereby performing suction recovery of the cartridge 610 through a cap opening 713. A moving member 715 makes a cleaning blade 714 movable forward and backward. A main body support plate 716 supports the cleaning blade 714 and moving member 715. The cleaning blade 714 need not be the form shown in FIG. 6C, and it is, of course, also possible to apply a well-known cleaning blade to this embodiment. A lever 717 is formed to start the suction of the suction recovery, and moves in synchronism with the movement of a cam 718 that engages with the carriage 720, thereby controlling the driving force from the driving motor 701 by a known transmitting means such as clutch switching. A printing controller (not shown) for applying a signal to the heat generating unit 602 formed in the cartridge 610 and controlling the driving of the mechanisms such as the driving motor 701 is formed in the apparatus main body.

Figure 6D:
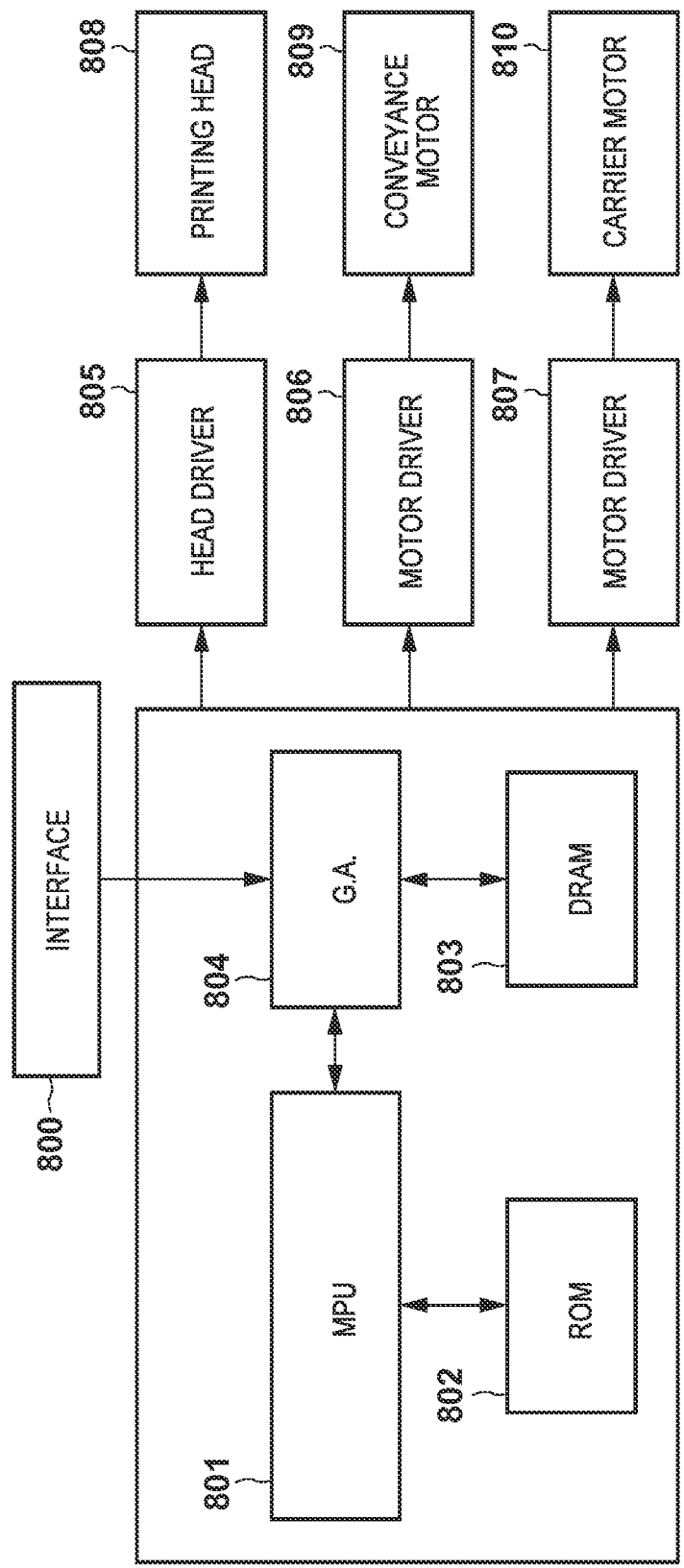

Next, the configuration of the control circuit for controlling the printing of the inkjet printing apparatus 700 will be explained with reference to a block diagram shown in FIG. 6D. This control circuit includes an interface 800 for receiving a print signal, an MPU (microprocessor) 801, and a program ROM 802 storing a control program to be executed by the MPU 801. The control circuit also includes a dynamic RAM (Random Access Memory) 803 for saving various kinds of data (for example, the above-mentioned print signal and print data to be supplied to the head), and a gate array 804 for controlling the supply of print data to a printing head 808. The gate array 804 also controls data transfer between the interface 800, MPU 801, and RAM 803. The control circuit further includes a carrier motor 810 for carrying the printing head 808, and a conveyance motor 809 for conveying print paper. In addition, the control circuit includes a head driver 805 for driving the printing head 808, and motor drivers 806 and 807 for respectively driving the conveyance motor 809 and carrier motor 810. The operation of the above-mentioned control configuration is as follows. When a print signal enters the interface 800, the print signal is converted into print data for printing between the gate array 804 and MPU 801. Then, the motor drivers 806 and 807 are driven, and the printing head is driven in accordance with the print data supplied to the head driver 805, thereby printing the data.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-254627, filed Nov. 20, 2012 which is hereby incorporated by reference herein in its entirety.

What is claimed is:

1. A semiconductor device comprising:
   a first bonding pad;
   a first unit circuit, a second unit circuit, and a third unit circuit arranged in a first direction from the first bonding pad in this order;
   a first electrically conductive pattern configured to connect the first unit circuit to the first bonding pad;
   a second electrically conductive pattern configured to connect the second unit circuit to the first bonding pad; and
   a third electrically conductive pattern configured to connect the third unit circuit to the first bonding pad,
   wherein each of the first, second, and third electrically conductive patterns includes:
      a first portion connected to the first bonding pad and extending in the first direction; and
      a second portion connected to the corresponding unit circuit, and
   wherein the second portion of the first electrically conductive pattern, the second portion of the second electrically conductive pattern, and the second portion of the third electrically conductive pattern are arranged in the first direction from the first bonding pad in this order,
   wherein the first portion and the second portion of the first electrically conductive pattern are positioned between the first portion of the second electrically conductive pattern and the first portion of the third electrically conductive pattern in a second direction which is perpendicular to the first direction.

2. The device according to claim 1, further comprising:
a fourth unit circuit adjacent to the third unit circuit in the first direction; and
a fourth electrically conductive pattern configured to connect the fourth unit circuit to the first bonding pad,
wherein the fourth electrically conductive pattern includes:
a first portion connected to the first bonding pad and extending in the first direction; and
a second portion connected to the fourth unit circuit and adjacent to the third electrically conductive pattern in the first direction,
wherein the second portion of the second electrically conductive pattern is positioned between the first portion of the third electrically conductive pattern and the first portion of the fourth electrically conductive pattern in the second direction.

3. The device according to claim 1,
wherein the first portion of the third electrically conductive pattern includes a first region and a second region which is closer to the first pad than the first region, and
wherein a width of the first region is greater than a width of the second region.

4. The device according to claim 1, wherein a resistance value of the first electrically conductive pattern from the first bonding pad to the first unit circuit is equal to a resistance value of the second electrically conductive pattern from the first bonding pad to the second unit circuit.

5. The device according to claim 1, wherein the second portion of each of the first, second, and third electrically conductive patterns extends in the first direction.

6. The device according to claim 1, further comprising:
a second bonding pad;
a fourth electrically conductive pattern configured to connect the first unit circuit to the second bonding pad;
a fifth electrically conductive pattern configured to connect the second unit circuit to the second bounding pad; and
a sixth electrically conductive pattern configured to connect the third unit circuit to the second bounding pad,
wherein each of the fourth electrically conductive pattern, the fifth electrically conductive pattern, and the sixth electrically conductive pattern includes:
a first portion connected to the second bonding pad and extending in the first direction; and
a second portion connected to the corresponding unit circuit,
wherein the first, second, and third electrically conductive patterns and the fourth, fifth, and sixth electrically conductive patterns are arranged in the second direction, and
wherein a portion of one of the first, second, and third electrically conductive patterns, which is positioned closest to the fourth, fifth, and sixth electrically conductive patterns, and a portion of one of the fourth, fifth, and sixth electrically conductive patterns, which is positioned closest to the first, second, and third electrically conductive patterns, exist in positions overlapping each other in the first direction.

7. The device according to claim 6, wherein a portion of the first portion of the one of the fourth, fifth, and sixth electrically conductive patterns positioned closest to the first, second, and third electrically conductive patterns, protrudes toward the first, second, and third electrically conductive patterns than another portion of the first portion of the one of the fourth, fifth, and sixth electrically conductive patterns.

8. The device according to claim 6, wherein a resistance value of the fourth electrically conductive pattern from the second bonding pad to the first unit circuit is equal to a resistance value of the fifth electrically conductive pattern from the second bonding pad to the second unit circuit.

9. The device according to claim 6, wherein
each of the second portions of the fourth, fifth, and sixth electrically conductive patterns extends in the first direction, and
widths of the second portions of the fourth, fifth, and sixth electrically conductive patterns are equal.

10. The device according to claim 6,
wherein the first bonding pad and the second bonding pad exist on the same side with respect to the first, second, and third unit circuits,
a first end portion of the second portions of the first, second, and third electrically conductive patterns are connected to another portion of the first, second, and third electrically conductive patterns, respectively,
wherein a second end portion of the second portions of the fourth, fifth, and sixth electrically conductive patterns are connected to another portion of the fourth, fifth, and sixth electrically conductive patterns, respectively, and
wherein the second end portion is an end portion opposite to the first end portion in the first direction.

11. The device according to claim 6, wherein a width of the second portion of each of the first, second, and third electrically conductive pattern and a width of the second portion of each of the fourth, fifth, and sixth electrically conductive patterns are equal.

12. The device according to claim 6, wherein
each of the first, second, and third unit circuits includes a plurality of driving portions configured to discharge a liquid in a nozzle, and each driving portion includes a driving circuit, and an element driven by the driving circuit to apply, to the liquid, energy for discharging the liquid in the nozzle,
the second portion of each of the first, second, and third electrically conductive patterns is connected to one of a corresponding driving circuit and a corresponding element, and
the second portion of the each of fourth, fifth, and sixth electrically conductive patterns is connected to the other one of the corresponding driving circuit and the corresponding element.

13. A semiconductor device comprising:
a plurality of unit circuits arranged in a first direction;
a first bonding pad and a second bonding pad;
a plurality of first electrically conductive patterns, each of the plurality of first electrically conductive patterns being configured to connect a different one of the plurality of unit circuits to the first bonding pad; and
a plurality of second electrically conductive patterns, each of the plurality of second electrically conductive patterns being configured to connect a different one of the plurality of unit circuits to the second bonding pad,
wherein the plurality of first electrically conductive patterns and the plurality of second electrically conductive patterns are arranged in a second direction perpendicular to the first direction, and
a portion of one of the plurality of first electrically conductive patterns, which is positioned closest to the plurality of second electrically conductive patterns, and a portion of one of the plurality of second electrically conductive patterns, which is positioned closest to the plurality of first electrically conductive patterns, exist in positions overlapping each other in the first direction.

14. An apparatus comprising:
a liquid discharge head comprising a semiconductor device
    comprising:
    a first bonding pad;
    a first unit circuit, a second unit circuit, and a third unit circuit arranged in a first direction from the first bonding pad in this order;
    a first electrically conductive pattern configured to connect the first unit circuit to the first bonding pad;
    a second electrically conductive pattern configured to connect the second unit circuit to the first bonding pad; and
    a third electrically conductive pattern configured to connect the third unit circuit to the first bonding pad; and
a nozzle configured to discharge a liquid under the control of the semiconductor device,
wherein each of the first, second, and third electrically conductive patterns includes:
    a first portion connected to the first bonding pad and extending in the first direction; and
    a second portion connected to the corresponding unit circuit,
wherein the second portion of the first electrically conductive pattern, the second portion of the second electrically conductive pattern, and the second portion of the third electrically conductive pattern are arranged in the first direction from the first bonding pad in this order, and
wherein the first portion and the second portion of the first electrically conductive pattern are positioned between the first portion of the second electrically conductive pattern and the first portion of the third electrically conductive pattern in a second direction which is perpendicular to the first direction.

15. The apparatus according to claim 14, further comprising a liquid tank configured to contain ink.

16. The apparatus according to claim 14, further comprising a supply unit configured to supply a driving signal for causing the liquid discharge head to discharge a liquid.

17. An apparatus comprising:
a liquid discharge head comprising:
    a semiconductor device comprising:
        a plurality of unit circuits arranged in a first direction;
        a first bonding pad and a second bonding pad;
        a plurality of first electrically conductive patterns, each of the plurality of first electrically conductive patterns being configured to connect a different one of the plurality of unit circuits to the first bonding pad; and
        a plurality of second electrically conductive patterns, each of the plurality of second electrically conductive patterns being configured to connect a different one of the plurality of unit circuits to the second bonding pad; and
    a nozzle configured to discharge a liquid under the control of the semiconductor device,
wherein the plurality of first electrically conductive patterns and the plurality of second electrically conductive patterns are arranged in a second direction perpendicular to the first direction, and
wherein a portion of one of the plurality of first electrically conductive patterns, which is positioned closest to the plurality of second electrically conductive patterns, and a portion of one of the plurality of second electrically conductive patterns, which is positioned closest to the plurality of first electrically conductive patterns, exist in positions overlapping each other in the first direction.

18. The apparatus according to claim 17, further comprising a liquid tank configured to contain ink.

19. The apparatus according to claim 17, further comprising a supply unit configured to supply a driving signal for causing the liquid discharge head to discharge a liquid.

20. The device according to claim 1, wherein each of the first, second, and third electrically conductive patterns further comprises a third portion which connects the first portion and the second portion.

21. The device according to claim 1, wherein widths of the second portions of the first, second, and third electrically conductive patterns are equal.

22. The device according to claim 1, wherein a length of the first portion of the third electrically conductive pattern is greater than a length of the first portion of the second electrically conductive pattern, in the first direction, and
wherein the length of the first portion of the second electrically conductive pattern is greater than a length of the first portion of the first electrically conductive pattern, in the first direction.

23. The device according to claim 13,
wherein the portion of the one of the plurality of first electrically conductive patterns, which is positioned closest to the plurality of second electrically conductive patterns, protrudes toward the plurality of second electrically conductive patterns than an other portion of the one of the plurality of first electrically conductive patterns,
wherein the portion of the one of the plurality of second electrically conductive patterns, which is positioned closest to the plurality of first electrically conductive patterns, protrudes toward the plurality of first electrically conductive patterns than an other portion of the one of the plurality of first electrically conductive patterns,
wherein to the first pad, the portion is closer than the other portion in the one of the plurality of first electrically conductive patterns, and
wherein to the second pad, the other portion is closer than the portion in the one of the plurality of second electrically conductive patterns.

24. The device according to claim 13,
wherein each of the plurality of first electrically conductive pattern including:
    a first portion connected to the first bonding pad and extending in the first direction; and
    a second portion connected to the corresponding unit circuit,
wherein the second portion of the plurality of first electrically conductive patterns are arranged in the first direction, and
wherein a second portion of one of the plurality of first electrically conductive patterns is positioned between the first portion of another one of the plurality of first electrically conductive patterns and the first portion of another one of the plurality of first electrically conductive patterns in the second direction.

25. The device according to claim 13,
wherein each of the plurality of second electrically conductive patterns including:
    a first portion connected to the second bonding pad and extending in the first direction; and
    a second portion connected to the corresponding unit circuit and extending in a third direction which is parallel to and opposite to the first direction,
wherein the first portion includes a first region and a second region which is closer to the second bonding pad than the first region, and wherein a width of the first region is greater than a width of the second region in the second direction.

26. The apparatus according to claim 14, wherein the second portion of each of the first, second, and third electrically conductive patterns extends in the first direction.

27. The apparatus according to claim 14,
wherein the first portion of each of the first, second, and third electrically conductive patterns includes a first region and a second region which is closer to the first pad than the first region, and
wherein a width of the first region is greater than a width of the second region in the second direction.

28. The apparatus according to claim 14, wherein each of the first, second, and third electrically conductive patterns further comprises a third portion which connects the first portion and the second portion.

29. The apparatus according to claim 14, wherein a length of the first portion of the third electrically conductive pattern is greater than a length of the first portion of the second electrically conductive pattern, in the first direction, and
wherein the length of the first portion of the second electrically conductive pattern is greater than a length of the first portion of the first electrically conductive pattern, in the first direction.

30. The apparatus according to claim 17,
wherein the portion of the one of the plurality of first electrically conductive patterns, which is positioned closest to the plurality of second electrically conductive patterns, protrudes toward the plurality of second electrically conductive patterns than an other portion of the one of the plurality of first electrically conductive patterns,
wherein the portion of the one of the plurality of second electrically conductive patterns, which is positioned closest to the plurality of first electrically conductive patterns, protrudes toward the plurality of first electrically conductive patterns than an other portion of the one of the plurality of first electrically conductive patterns,
wherein to the first pad, the portion is closer than the other portion in the one of the plurality of first electrically conductive patterns, and
wherein to the second pad, the other portion is closer than the portion in the one of the plurality of second electrically conductive patterns.

31. The apparatus according to claim 17,
wherein each of the plurality of first electrically conductive pattern including:
a first portion connected to the first bonding pad and extending in the first direction; and
a second portion connected to the corresponding unit circuit,
wherein the second portion of the plurality of first electrically conductive patterns are arranged in the first direction, and
wherein a second portion of one of the plurality of first electrically conductive patterns is positioned between the first portion of another one of the plurality of first electrically conductive patterns and the first portion of another one of the plurality of first electrically conductive patterns in the second direction.

32. The apparatus according to claim 17,
wherein each of the plurality of second electrically conductive patterns including:
a first portion connected to the second bonding pad and extending in the first direction; and
a second portion connected to the corresponding unit circuit and extending in a third direction which is parallel to and opposite to the first direction,
wherein the first portion includes a first region and a second region which is closer to the second bonding pad than the first region, and
wherein a width of the first region is greater than a width of the second region in the second direction.

\* \* \* \* \*